(12) United States Patent
Montanari et al.

(10) Patent No.: US 8,447,540 B2
(45) Date of Patent: May 21, 2013

(54) METHOD FOR DETECTING, IDENTIFYING AND LOCATING PARTIAL DISCHARGES OCCURRING IN A DISCHARGE SITE ALONG AN ELECTRIC APPARATUS

(75) Inventors: Gian Carlo Montanari, Casalecchio di Reno (IT); Andrea Cavallini, San Pietro In Casale (IT); Gaetano Pasini, Marano Sul Panaro (IT)

(73) Assignee: Techimp Technologies S.R.L., Bologna (IT)

( * ) Notice: Subject to any disclaimer, the term of this patent is extended or adjusted under 35 U.S.C. 154(b) by 271 days.

(21) Appl. No.: 12/670,064

(22) PCT Filed: Jan. 31, 2008

(86) PCT No.: PCT/IB2008/050351
§ 371 (c)(1),
(2), (4) Date: Mar. 10, 2010

(87) PCT Pub. No.: WO2009/013639
PCT Pub. Date: Jan. 29, 2009

(65) Prior Publication Data
US 2011/0012586 A1    Jan. 20, 2011

(30) Foreign Application Priority Data
Jul. 26, 2007 (IT) .......................... PR2007A000059

(51) Int. Cl.
*G01R 31/00* (2006.01)

(52) U.S. Cl.
USPC ............................................ 702/58; 702/59

(58) Field of Classification Search
USPC ....................................................... 702/58, 59
See application file for complete search history.

(56) References Cited

U.S. PATENT DOCUMENTS
2009/0177420 A1 * 7/2009 Fournier et al. ................. 702/59

OTHER PUBLICATIONS

Puletti, F., et al., "Risk Management of HV Polymeric Cables Based on Partial Discharge Assessment", PES TD 2005/May 21-24, 2006, Piscataway, NJ, IEEE, Jan. 1, 2006, pp. 626-633.

(Continued)

*Primary Examiner* — Mohamed Charioui
*Assistant Examiner* — Manuel Rivera Vargas
(74) *Attorney, Agent, or Firm* — Pearne & Gordon LLP

(57) ABSTRACT

A method for detecting, identifying and locating partial discharges occurring in a discharge site along an electric apparatus comprises the following steps: detecting (1) electrical signals in a detection station; attributing (2) to each detected signal a value of a phase parameter; deriving (3) for each signal at least one shape parameter and one amplitude parameter; separating (4) the set of signals detected into sub¬ sets that are homogeneous relative to the shape parameter; identifying (5) sub-sets related to partial discharges and cataloguing them; repeating the above steps in a plurality of detection stations positioned along the apparatus; correlating (7) the sub-sets of signals detected in different detection stations and catalogued similarly; selecting (8) as a function of the amplitude and shape parameters of a sub-set among the correlated ones and locating (9) the partial discharges related to said sub-sets at the detection station of the selected sub-set. Known methods have poor effectiveness and/or reliability, especially for cables whose length exceeds 1-2 km or, alternatively, they require an excessively complex and costly field implementation.

8 Claims, 1 Drawing Sheet

OTHER PUBLICATIONS

Cavallini, A., et al., "Experience of Testing Polymeric HV Cable Systems by an Innovative Partial Discharge Measurement Approach", Power System Technology, 2004, Powercon 2004, 2004 International Conference on Singapore, Nov. 21-24, 2004, Piscataway, NJ, IEEE, vol. 2, Nov. 21, 2004, pp. 1684-1688.

Gopal, S., et al., "Partial Discharge Pattern Classification Using Fuzzy Expert System", Solid Dielectrics, 2004, ICSD 2004, Proceedings of the 2004 IEEE International Conference on Toulouse, France Jul. 5-9, 2004, Piscataway NJ, IEEE US, Jul. 5, 2004, vol. 2, pp. 653-656.

Chen, M., et al., "Methods of Discriminating Partial Discharge and Noise for Power Cable Lines", 2001 Annual Report Conference on Electrical Insulation and Dielectric Phenomena, Kitchener, Ontario, Canada, Oct. 14-17, 2001, Annual Report Conference on Electrical Insulation and Dielectric Phenomena, New York, NY, IEEE, Oct. 14, 2001, pp. 285-289.

* cited by examiner

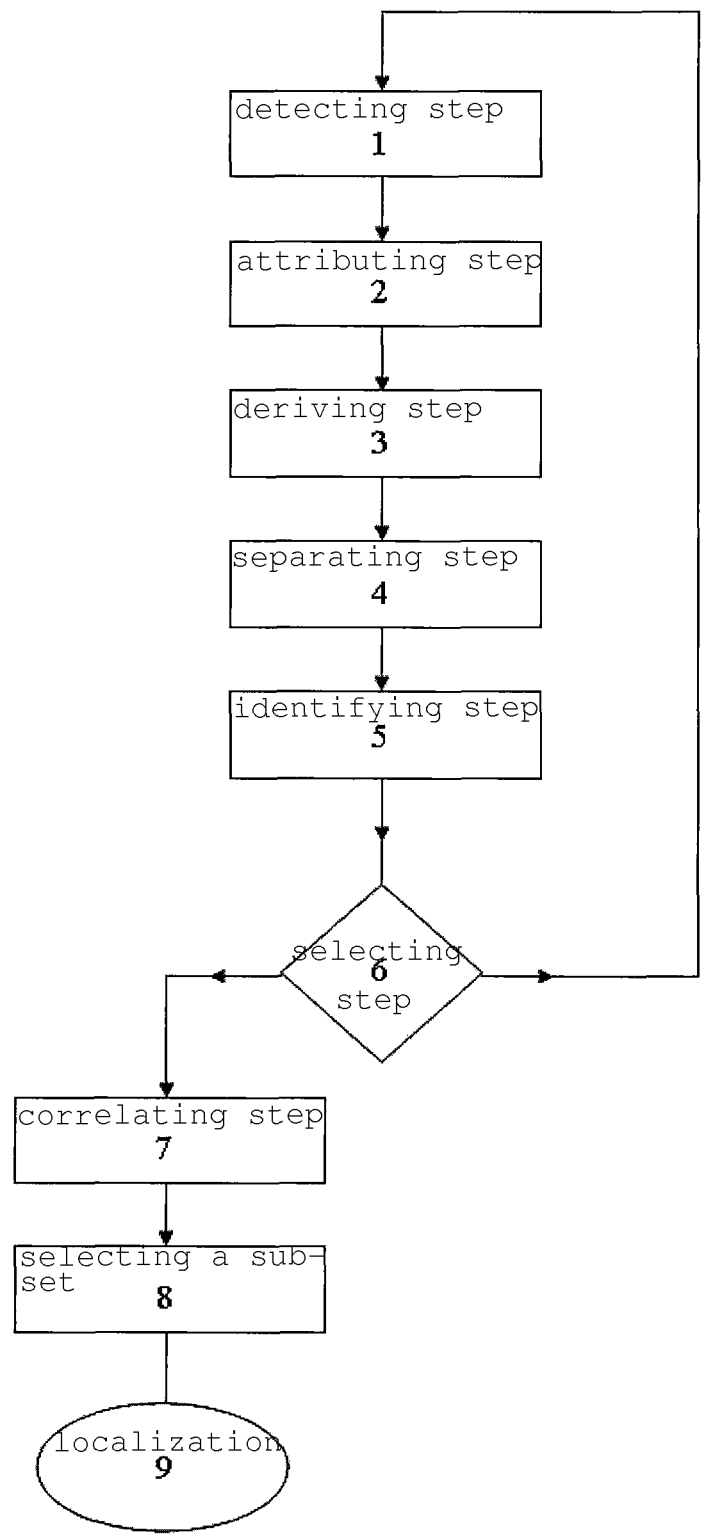

METHOD FOR DETECTING, IDENTIFYING AND LOCATING PARTIAL DISCHARGES OCCURRING IN A DISCHARGE SITE ALONG AN ELECTRIC APPARATUS

The present invention relates to a method for detecting, identifying and locating partial discharges occurring in a discharge site along an electric apparatus. More in general, the technical field of the present invention is that of the diagnostics of electrical systems (in particular in high voltage) through the detection/processing of partial electric discharges.

Note that a partial discharge is an electric discharge that involves a limited portion of an insulator of an electrical system, therefore it does not cause the immediate failure of the system, but rather its progressive degradation. Moreover, partial discharges have, by their nature, a development that is substantially limited to a defect of the insulating system.

In this light, the diagnostic technique based on the detection and interpretation of partial discharges are among the most promising ones and they are widely studied within scientific research, because the assessment of the signals related to partial discharges enables to investigate the nature of the defects of the insulating system in which the discharges occur and the position of the defects within the insulating system itself.

In particular, the present invention relates to diagnostics on electrical cables for medium and high voltages (and also on autotransformers). In this type of apparatus, it is desirable to identify any defects which may constitute causes of failure for the cable, e.g. defects situated in the junctions or in the terminations or even in the actual insulator of the cable. Such defects are generally the site of partial discharge activity; therefore, what is generally attempted is to identify said defects by detecting the corresponding partial discharge activities by means of appropriate sensors coupled to the cable to be assessed.

However, identifying defects in cables by detecting partial discharges has two main difficulties.

A first difficulty consists in reliably identifying the partial discharges to be examined. In general, there are numerous signals that are coupled to the sensors in addition to the signals corresponding to the partial discharge activities to be identified; said undesired signals can be constituted by background noise, or other kinds of disturbances or else by additional partial discharge activities outside the cable or otherwise not dangerous (but mistakable for the dangerous ones to be identified). All these signals are substantially superposed to those of the partial discharges to be detected and oftentimes (especially if their amplitude is greater than the signals to be detected) they prevent their identification. A second difficulty is to locate the source (or the sources) of the discharges detected within the cable. It is not sufficient to detect the presence of a defect, but it is also necessary to establish, at least with a reasonable degree of approximation, where the defect is situated within the cable, to intervene effectively when conducting maintenance.

To overcome the first difficulty, known methods provide for the use of sensors and filtering systems appropriately adjusted in the attempt to detect the partial discharge signals without detecting the signals related to noise.

However, such methods present the following limitations. It is impossible to set up sensors optimised for any circumstance and filtering systems are often ineffective. Moreover, since, the frequency of the discharge signals of interest is not known a priori, there is the risk of filtering those very signals.

Lastly, when the signals of the partial discharge activities to be detected are superposed to other partial discharge signals to be ignored (e.g. because they are external to the cable), there is the risk that said signals are impossible to treat selectively by means of filtering systems in use (constituted for example by band-pass analogue filters).

With regard to locating a discharge site along a cable, different techniques are known.

One technique, also called reflectometric technique, consists of acquiring the signals in a detection station positioned at one end of the cable and in assessing the time elapsed between a signal and the signal generated by the reflection of the signal at the opposite end of the cable. Then, the distance of the source of that signal from the point of detection is calculated on the basis of the speed of propagation of signals in that cable.

This technique has poor reliability for long cables, because the signals, as they travel through the cable, are attenuated to the point where there is the risk of not being able to detect them in the detection station. Another technique consists of coupling to the cable a plurality (at least 2, in general 3) of sensors (then defining a plurality of detection stations) in different positions of the cable. When the signal in one of the sensors exceeds a predetermined level, the signals coming from the various sensors are acquired in synchronous mode; the time window of the acquisition must be sufficiently long to allow the same pulse in transit in the various sensors to be measured. Comparing the arrival times of the same signals in the different sensors, the source of the signals along the cable can be located.

This technique is quite accurate, but it requires particularly long times for the installation of the necessary equipment and its cost is very high. Therefore, to the difficulties and to the limitations of the prior art with regard to locating the detected signals are added those pertaining to the identification of the signals actually associated to the partial discharge activities taking place in the cable and hence to be located.

In this light, known techniques do not assure reliable results and they are is often found to be ineffective.

The object of the present invention is to eliminate the aforesaid drawbacks and to make available a method for detecting, identifying and locating partial electric discharges occurring in a discharge site along an electric apparatus that is particularly simple and convenient to apply and at the same time effective.

Said object is fully achieved by the method of the present invention, which is characterised by the content of the appended claims and in particular in that it comprises the following steps:

detecting analogue electrical signals captured by a sensor operatively coupled to the apparatus in a detection station and generating corresponding digital signals representative of the wave forms of said analogue signals;

attributing to each detected signal a value of a phase parameter representative of the phase of the voltage applied to the electric apparatus at the instant of the detection of the signal;

deriving, for each of said digital signals, at least one shape parameter correlated to the wave form of that signal and at least one amplitude parameter correlated to the amplitude of that signal;

separating the set of said detected digital signals into sub-sets, so that the digital signals of each sub-set have similar values of the shape parameter (or shape parameters);

identifying the sub-sets of signals relating to partial discharges and cataloguing them, as a function of statistical evaluations based on the values of the parameters of amplitude and phase for the signals of each sub-set evaluated individually;

repeating the previous steps in a plurality of detection stations positioned along the apparatus;

correlating, based on the amplitude and phase parameters, the sub-sets of signals detected in different detection stations; this procedure is aimed at identifying the signals produced by the same defect or disturbance in the various detection stations;

selecting a sub-set within a group of correlated sub-sets, based on the values of the shape and amplitude parameters for the signals of the different sub-sets of said group, and locating the partial discharges related to said signals at the detection station of the selected sub-set.

BRIEF DESCRIPTION OF THE DRAWING

These and other characteristics shall become more readily apparent from the following description of a preferred embodiment, illustrated purely by way of non limiting example in the accompanying drawing table, in which the sole figure schematically shows the method according to the present invention.

The method according to the present invention is a method for identifying and locating partial discharges occurring in a discharge site along an electric apparatus.

In particular, the method of the invention is aimed at the diagnostic assessment of the medium and high voltage electric cables.

This method provides for conducting acquisitions of electrical signals detected by means of sensors coupled with the apparatus. The term "acquisition" means the detection of a plurality of electrical signals in a time interval, said time interval defining the duration of the acquisition. The acquisition can entail detecting a predetermined number of signals or, alternatively, detecting all the signals captured by the sensors in a predetermined time interval. As is well known, it is essential that an acquisition includes a plurality of detected signals, in order to evaluate the signals from the statistical viewpoint.

In this light, note that the expression "identifying" means recognising a set of electrical signals detected in an acquisition as related to an activity of partial discharges and deriving information about the nature of the defect in which said partial discharges occurred.

The method of the invention comprises a preliminary step of identifying a plurality of detection stations along the apparatus to be evaluated, whereat the sensor can be coupled for the detection of the electrical signals.

In particular, if the apparatus to be evaluated is an electrical cable, the detection stations are positioned, preferably, at accessories of the cable, i.e. at terminals and junctions.

The method of the present invention originally comprises the following steps.

A first step (designated with the reference number 1 in the figure) is a step of detecting analogue electrical signals captured by the sensor operatively coupled to the apparatus in a detection station and generating corresponding digital signals representative of the wave form of the analogue signals detected.

Thus, the first step consists of an acquisition conducted with he sensor positioned in a predetermined detection station.

Preferably, the sensor is first positioned at one end of the apparatus; i.e., the first detection section used is a detection section at one end of the apparatus (e.g. at a terminal, if the apparatus is a cable).

A second step (designated with the number 2 in the figure) is a step of attributing to each detected signal a value of a phase parameter representative of the phase of the voltage applied to the electric apparatus at the instant of detection of the signal, using a synchronisation probe (substantially known) positioned along the electric apparatus.

The attribution step presupposes that the electric apparatus to be evaluated is subjected to alternating voltage (AC). According to a known technique, the phase angle of the voltage is detected in the instant in which a signal is detected and said angle is attributed to the signal.

A third step (designated with the number 3 in the figure) is a step of deriving, for each of said digital signals, at least one shape parameter correlated to the wave form of that signal and at least one amplitude parameter correlated to the amplitude of that signal.

In particular, preferably a first shape parameter (T) is measured, correlated to the time duration of the signal, and a second shape parameter (B) is measured, con-elated to the frequency content of the signal, i.e. the equivalent bandwidth of the signal.

To calculate said first and second form parameter, preferably the following formulas are used.

$$T = \frac{\int (t-t_0)^2 x(t)^2 dt}{\int x(t)^2 dt}$$

$$B = \frac{\int \omega^2 X(\omega)^2 d\omega}{\int X(\omega)^2 d\omega}$$

in which:

$$t_0 = \frac{\int t x(t)^2 dt}{\int x(t)^2 dt}$$

With regard to the derivation of the amplitude parameter, preferably the procedure is as follows.

The first peak of the signal is measured. Said peak constitutes the amplitude parameter. Alternatively, the signal can be filtered using known techniques and use the peak of the filtered signal as the amplitude parameter.

A fourth step (designated by the number 4 in the figure) is a step of separating the set of said detected digital signals (within the same acquisition) into sub-sets, so that the digital signals of each sub-set have similar values of the shape parameter.

Therefore, starting from a set of signals detected in a given acquisition, with the separation step one obtains (in general) a plurality of sub-sets that are homogeneous relative to the wave form of the signals.

This advantageously enables to distinguish signals having different sources and, at the same time, to group signals having the same source. The starting assumption is that the wave form of a signal depends on the source of the signal and in particular on the nature of the source (which directly influences the shape of the generated signals) and on the position of the source relative to the detection station (which determines the transfer function for the signals in their path from the site in which they are generated and the detection station).

Note that the separation step preferably provides for grouping in a same sub-set signals positioned in a same region of a reference plane having the first shape parameter B and the second shape parameter T as coordinates.

In this way, signals positioned in a same region of said reference plane are grouped in a same sub-set.

Said grouping is preferably obtained with a classifier operating in fuzzy logic on the basis of the assessment of distances of the signals from reference points in said plane. However, other known techniques can also be used.

Following the separation step, to each sub-set are associated values of the shape and amplitude parameters that are representative or of reference for that sub-set.

A fifth step (designated with the number 5 in the figure) is a step of identifying the sub-sets of signals relating to partial discharges and cataloguing them, as a function of the values of the parameters of amplitude and phase for the signals of each sub-set evaluated individually.

In particular, in the identification step all the sub-sets of signals detected in a given acquisition are reviewed.

Each sub-set, on the basis of statistical evaluations applied to the signals of that sub-set, is attributed, alternatively:
- to a partial discharge activity in the apparatus, in which case the sub-set is stored and catalogued;
- to another source (e.g. noise or some interference), in which case the sub-set is substantially ignored or rejected.

With regard to the identification of a set of electrical signals as related to a partial discharge activity and its cataloguing so that it can be attributed a degree of similitude to another set in a comparison based on the amplitude and phase parameters, several techniques, substantially known in the literature, can be adopted.

Fore example, the values of the amplitude and phase parameters of the signals of a sub-group are represented in a three-dimensional histogram, which constitutes a reference chart or pattern whose conformation is univocally correlated to the type of defect relating to said partial discharge signals. Essentially, said reference chart is defined by the signals of that sub-set shown as points in a reference plane having the phase and amplitude parameters as co-ordinates.

In this light, in the identification step the cataloguing is preferably performed according to the conformation of said reference chart.

Preferably, the step of identifying a sub-set provides for the use of a fuzzy inference engine operating as a function of the values of the phase and amplitude parameters for the signals of that sub-set or of parameters derived therefrom.

Note that the steps described so far pertain to a single acquisition, i.e. to electrical signals detected at a same detection station, in an acquisition time interval.

The method of the invention provides for a repetition of the previous steps (detection, attribution, derivation, separation and identification) in a plurality of detection stations located along the apparatus, thus conducting a plurality of corresponding acquisitions.

In particular, if the apparatus to be evaluated is a cable, said steps are repeated at detection stations positioned at the accessories. Preferably, the first acquisition is conducted at a terminal, the second acquisition in a junction positioned in proximity to said terminal, and the subsequent acquisitions at the junctions located progressively farther from said terminal, to conduct the last acquisition at the opposite terminal of the cable.

Therefore, at the end of each sequence of said steps, the method of the invention comprises a step of selecting (represented schematically with a decision block 6 in the figure) between the two following alternatives:
- repetition of the aforesaid steps (detection, attribution, derivation, separation and identification) in a different detection station;
- continuation of the method moving on to additional subsequent steps, when said steps have been executed in all the detection stations of interest.

In this light, note that the different detection steps must necessarily be performed with the sensor coupled in respective detection stations located along the apparatus (distanced from each other); instead, the attribution, derivation, separation and identification steps can be performed anywhere (with no need for connection to the sensor) and they can be performed at separate times, because the detected signals are preferably stored, to be processed at any time. Therefore, the attribution, derivation, separation and identification steps pertaining to the different acquisitions need not be performed with the same time sequence with which the corresponding detection steps have been performed.

Thus, after repeating the detection, attribution, derivation, separation and identification steps at the plurality of detection stations of interest, the subsequent steps, described below, are performed.

A sixth step (designated with the number 7 in the figure) is a step of correlating the sub-sets of signals detected in different detection stations and catalogued in similar fashion.

The correlation step preferably provides for comparing the reference charts of the sub-sets relating to the various acquisitions and identified as related to partial discharge activities in the identification step.

Therefore, the correlation step enables to evaluate the partial discharges of a same activity (identified as partial discharges and catalogued similarly) detected in different detection stations (which are part of subgroups pertaining to different acquisitions).

A seventh step (designated with the number 8 in the figure) is a step of selecting a sub-set, within a group of correlated sub-sets, based on the values of the form and amplitude parameters for the signals of the different sub-sets of said group.

In particular, the sub-set is preferably selected whose signals have maximum values of the amplitude parameter and of the shape parameter B correlated to the frequency content of the signals, relative to the other sub-sets of the group of correlated sub-sets.

In case of ambiguity, the sub-set is preferably selected whose signals have maximum values of the amplitude parameter and of the shape parameter B correlated to the frequency content of the signals and is minimum values of the shape parameter T correlated to the time duration of the signals, relative to the other sub-sets of the group of correlated sub-sets.

The consequence of said selection is a localization or location (indicated with the number 9 in the figure) of the discharge source in which the partial discharges relating to the signals of the considered sub-sets take place.

The selection step provides for locating the partial discharges related to said signals at the detection station of the selected sub-set.

Note that the locating step is based on the following consideration. The discharge signals detected are the more attenuated and distorted relative to the signals originated in the discharge site, the greater the distance between the discharge site and the detection station.

Therefore, if signals belonging to a same discharge activity in different detection stations positioned along the apparatus are detected, the conclusion can be drawn that the less distorted signals (with higher values of the shape parameter B and lower values of the shape parameter T) and the less attenuated signals (with higher values of the amplitude parameters) were detected closer, i.e. in the detection station nearer to the discharge site.

Note that the determination of the location, obtained with the method of the invention, is the more precise the closer to each other and more numerous are the detection stations.

Therefore, the present invention advantageously enables to identify and locate partial discharge signals within an electric apparatus, e.g. a cable for medium and high voltages, in particularly simple fashion. Said method provides for acquiring signals detected by a sensor coupled to the apparatus in a detection station, moving the sensor progressively along the apparatus, with no need to use a plurality of mutually synchronised sensors.

Moreover, the method of the present invention is particularly effective, because the results of the identification and of the location determination are not penalised by the distance between the sensor and the site of the discharges, because the acquisitions are carried out along the entire apparatus and not only in a detection station.

The invention claimed is:

1. A method for detecting, identifying and locating partial discharges occurring in a discharge site along an electric apparatus, wherein said electric apparatus is a cable having a plurality of accessories, comprising the following steps:
    identifying a plurality of detection stations along the apparatus to be evaluated, wherein said detection stations are spaced apart and positioned along substantially the whole length of the apparatus, wherein detection stations are positioned at a plurality of accessories of the cable;
    detecting (1) analogue electrical signals captured by a sensor operatively coupled to the apparatus in a detection station and generating a set of corresponding digital signals representative of the wave forms of said analogue signals;
    attributing (2) to each detected signal a value of a phase parameter representative of the phase of the voltage applied to the electric apparatus at the instant of the detection of the signal;
    deriving (3), for each of said digital signals, at least one shape parameter correlated to the wave form of that signal and at least one amplitude parameter correlated to the amplitude of that signal;
    separating (4) the set of said detected digital signals into sub-sets, so that the digital signals of each sub-set have similar values of the shape parameter;
    identifying (5) the sub-sets of signals relating to partial discharges and cataloguing them, as a function of statistical evaluations based on the values of the parameters of amplitude and phase for the signals of each sub-set evaluated individually;
    repeating the previous steps, for each detection station of said plurality of detection stations positioned along the apparatus, until said steps have been executed in all the detection stations, wherein said sensor is moved progressively along the apparatus, from one detection station to the subsequent detection station;
    correlating (7) the sub-sets of signals catalogued similarly and detected in said different detection stations positioned at different accessories of the cable;
    selecting (8) a sub-set within a group of correlated sub-sets, based on the values of the shape and amplitude parameters for the signals of the different sub-sets of said group, and
    locating (9) the partial discharges related to said signals at the detection station of the selected sub-set, wherein, in the selection step (8), the sub-set is selected as a location of the partial discharge source whose signals have maximum values of the amplitude parameter and of the shape parameter correlated to the frequency content of the signals and minimum values of the shape parameter correlated to the time duration of the signal, relative to the other sub-sets of the group of correlated sub-sets, corresponding to the other detection stations positioned at different accessories of the cable.

2. Method as claimed in claim 1, wherein the shape parameter derived in the derivation step (2) is a parameter correlated to the frequency content of the signal.

3. Method as claimed in claim 2, wherein in the selection step (8) the sub-set is selected whose signals have maximum values of the amplitude parameter and of the shape parameter correlated to the frequency content of the signals, relative to the other sub-sets of the group of correlated sub-sets.

4. Method as claimed in claim 1, wherein the derivation step (2) provides for deriving, for each of said digital signals, a first shape parameter, correlated to the frequency content of the signal, and a second shape parameter, correlated to the time duration of the signal.

5. Method as claimed in claim 4, wherein the separation step (3) provides for grouping in a same sub-set signals positioned in a same region of a reference plane having said first and second shape parameter as co-ordinates.

6. Method as claimed in claim 1, wherein the step (5) of identifying a sub-set provides for the use of a fuzzy inference engine operating as a function of the values of the phase and amplitude parameters for the signals of that sub-set.

7. Method as claimed in claim 1, wherein, in the identification step (5), the cataloguing is conducted as a function of a shape of a pattern defined by the signals of that sub-set shown as points in a reference plane having the values of the phase and amplitude parameters as coordinates.

8. Method as claimed in claim 1, wherein the electric apparatus is a medium or high voltage cable and the detection stations are positioned at accessories of the cable.

* * * * *